United States Patent
Shou

(10) Patent No.: US 8,537,865 B1
(45) Date of Patent: Sep. 17, 2013

(54) FIBER-LASER PUMPED BY STABILIZED DIODE-LASER BAR STACK

(75) Inventor: Nathan Shou, San Francisco, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 13/559,516

(22) Filed: Jul. 26, 2012

(51) Int. Cl.
*H01S 3/30* (2006.01)

(52) U.S. Cl.
USPC .............................. 372/6; 359/618

(58) Field of Classification Search
USPC ................ 372/6, 50.23, 50.12, 23; 257/98; 359/618
See application file for complete search history.

(56) References Cited

U.S. PATENT DOCUMENTS

| | | | |
|---|---|---|---|
| 6,115,401 A | | 9/2000 | Scobey et al. |
| 6,124,973 A * | | 9/2000 | Du et al. ........................ 359/618 |
| 6,707,072 B2 | | 3/2004 | Ohkubo et al. |
| 6,940,881 B2 * | | 9/2005 | Pontis et al. ............... 372/29.02 |
| 7,212,553 B2 | | 5/2007 | Starodoumov et al. |
| 2004/0008742 A1 | | 1/2004 | Chou et al. |
| 2007/0127539 A1 | | 6/2007 | Wang et al. |
| 2008/0025353 A1 | | 1/2008 | Govorkov et al. |
| 2010/0226405 A1 * | | 9/2010 | Chuyanov et al. ......... 372/50.12 |

OTHER PUBLICATIONS

Minelly et al., U.S. Appl. No. 13/074,593, filed Mar. 29, 2011, titled "High-Power CW Fiber-Laser", 23 pages.

* cited by examiner

*Primary Examiner* — Jessica Stultz
*Assistant Examiner* — Tuan Nguyen
(74) *Attorney, Agent, or Firm* — Morrison & Foerster LLP

(57) ABSTRACT

A fiber is laser is pumped by radiation from a plurality of diode-laser bars which are wavelength-locked by a single feedback mirror in combination with a single band-pass filter. The locked wavelength of the plurality of diode-laser bars is tunable by tilt-tuning the band-pass filter.

12 Claims, 8 Drawing Sheets

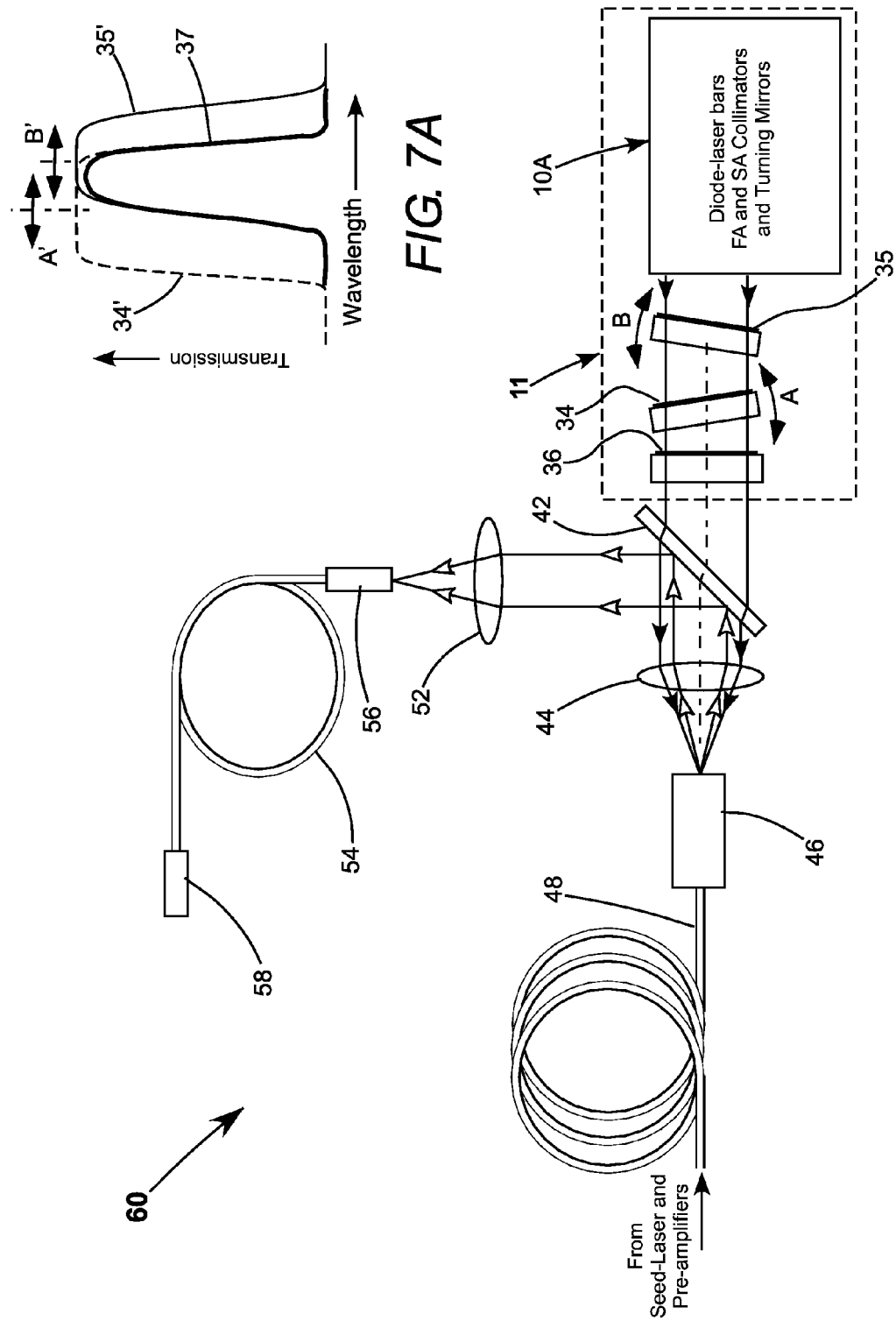

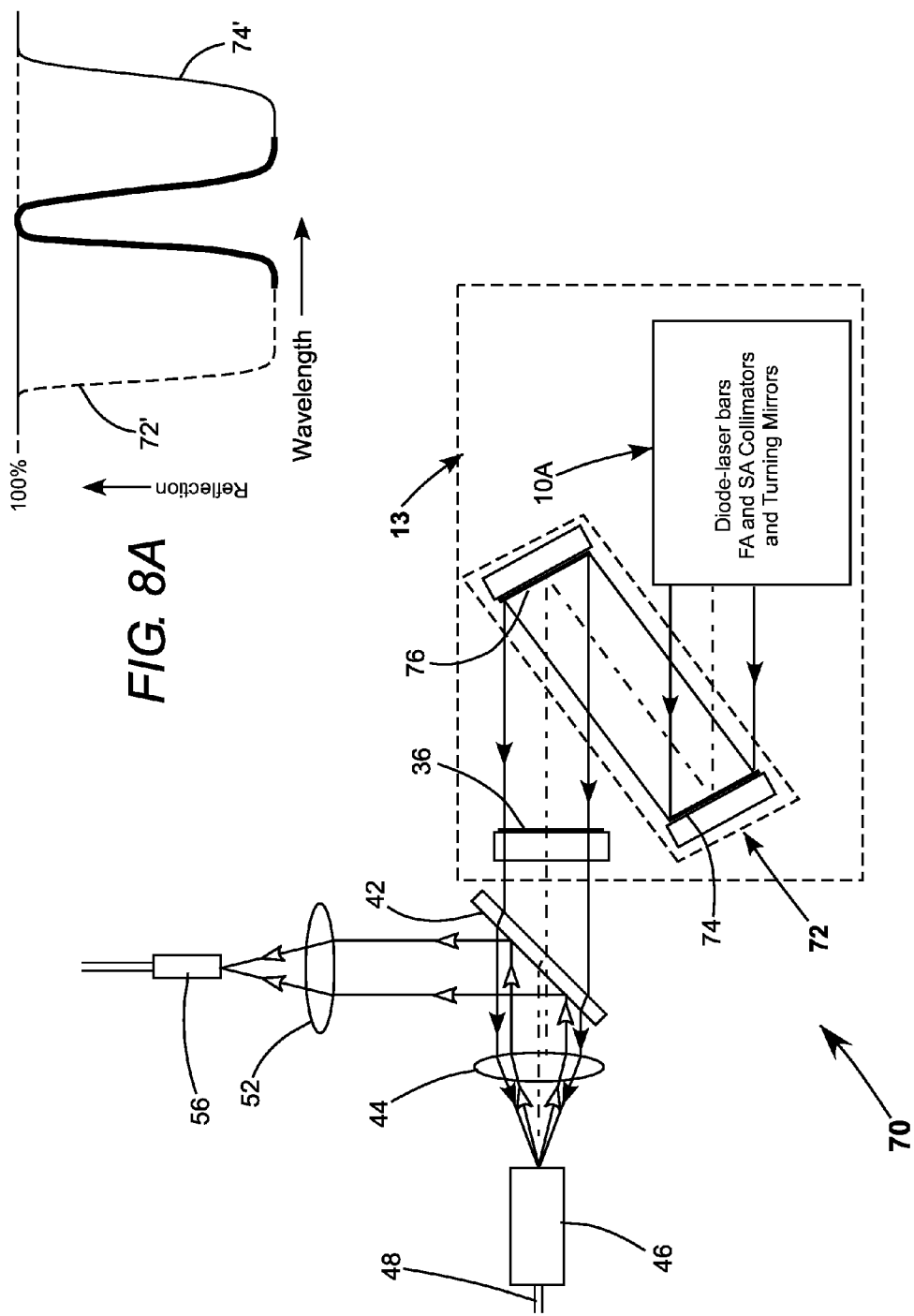

FIBER-LASER PUMPED BY STABILIZED DIODE-LASER BAR STACK

TECHNICAL FIELD OF THE INVENTION

The present invention relates in general to high-power fiber lasers and fiber amplifiers. The invention relates in particular to fiber lasers and fiber amplifiers having a gain-fiber cladding pumped by radiation focused into an end of the fiber from a plurality of diode-laser bars.

DISCUSSION OF BACKGROUND ART

Fiber-lasers and fiber MOPAs (master oscillator power amplifier systems) are finding increasing use in laser machining and laser material processing applications. In most such applications throughput is typically dependent on available output-power of the laser or MOPA.

Fiber-lasers and MOPA's typically pumped with diode-laser radiation. In early high-power lasers, radiation from a plurality of individual diode-lasers was coupled into a gain-fiber of the laser of MOPA by a corresponding plurality of pump-radiation transport-fibers fused into the cladding of the gain-fiber.

As power output requirements increased, it has been found more convenient to directly focus the output of a plurality of diode-laser bars into one or both ends of a gain-fiber of the laser or MOPA. A diode-laser bar includes a plurality of individual emitters formed in a common substrate (the "bar"). A commercially available single diode-laser bar can provide a total power output-power of between about 50 and 100 Watts. When more power is required a plurality of diode-laser bars can be physically stacked on above another. Alternatively the plurality of diode-laser bars can be mounted separately with the output beams from the beams optically stacked one above another.

Although the pump radiation absorption spectrum of certain gain-fibers, such as ytterbium-doped (Yb-doped) gain-fibers is relatively broad, it is still preferable to "wavelength-lock" at a preferred wavelength. The bars and individual emitters can have a spread of peak-gain wavelengths around a gain-bandwidth of about 30 nanometers (nm) for emitters emitting around 900 nm. The individual emitters have an emitting aperture on the order of 100 micrometers ($\mu$m) wide in a so called slow (low divergence) axis and about 1.0 $\mu$m high in a so called fast (high divergence) axis.

Typically a volume Bragg grating (VBG) is used for wavelength locking diode-laser bars. This serves essentially as a narrow-band feedback mirror providing an external cavity for all of the emitters. A problem with such an arrangement is that a special glass is required for forming a VBG. This glass cannot be optically polished to a sufficient optical quality to ensure that fed-back radiation goes back entirely to the emitters of origin. This leads to some of the power out being unlocked. The unlocked power is less absorbed by the fiber laser. This can lead to stray power causing optical damage to fiber connectors.

Another problem with a VBG is that the reflection wavelength is essentially fixed. Generally it is desirable that pump radiation is absorbed along the entire length of a gain-fiber. An ability to tune the wavelength of wavelength-locking feed-back would provide a means of adjusting the pump radiation wavelength toward the edge of an absorption-peak to provide a lower absorption and a longer propagating length or toward the center of the absorption-peak to provide a higher absorption and a shorter propagation distance. There is a need for a wavelength locking arrangement for a plurality of diode-laser bars which will provide locked-wavelength tunability and minimize unlocked radiation in the combined output of the diode-laser bars.

SUMMARY OF THE INVENTION

In one aspect, fiber laser apparatus in accordance with the present invention comprises a gain-fiber, a band-pass filter, a partially reflective and partially transmissive feedback mirror, a focusing lens, and a plurality of diode-laser bars, each thereof including a plurality of diode-laser emitters, each emitter for emitting a beam of radiation having a lasing wavelength. The diode-laser bars and emitters therein are characterized as having a slow-axis in the length of the diode-laser bars, a fast-axis in the height direction of the diode-laser bars and a propagation axis perpendicular to the fast-axis and the slow-axis. Each diode-laser bar has a first collimating lens associated therewith for collimating the beams of radiation from the emitters in the fast-axis, and plurality of second collimating lenses associated therewith for collimating the fast-axis collimated beams in the slow-axis thereby producing a set of fast- and slow-axis collimated beams propagating from each of the diode-laser bars. The fast- and slow-axis collimated beam-sets are transmitted through the band-pass filter in a forward direction on beam-paths parallel to each other in the fast-axis to the feedback mirror. The feedback mirror is arranged to reflect a first portion of the radiation in each of the beams-sets back through the band-pass filter in a reverse direction along the beam paths to the diode-laser bars from which the beam-sets were emitted for locking the lasing wavelength at a value determined by the band-pass filter. A second portion of the locked-wavelength radiation in the beam-sets is transmitted through the feedback mirror to the focusing lens, and focused by the focusing lens into one end of the gain-fiber for optically pumping the gain-fiber.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 7 schematically illustrates one preferred embodiment of a fiber-amplifier in accordance with the present invention optically pumped by a pump-radiation generator similar to the generator of FIG. 1 but wherein the wavelength of the diode-laser bars is locked by a single feedback mirror in combination with two band-pass filter elements in series each thereof tilt tunable for providing a net band-pass which can be varied in center wavelength and band-width.

FIG. 7A schematically illustrates individual and net transmission spectra of the band-pass filter elements of FIG. 7.

FIG. 8 schematically illustrates another preferred embodiment of a fiber-amplifier in accordance with the present invention similar to the embodiment of FIG. 7, but wherein the two band-pass filter elements are used in a reflective mode.

FIG. 8A schematically illustrates individual and net reflection spectra of the band-pass filter elements of FIG. 8.

DETAILED DESCRIPTION OF THE INVENTION

Figures 1, 1A:
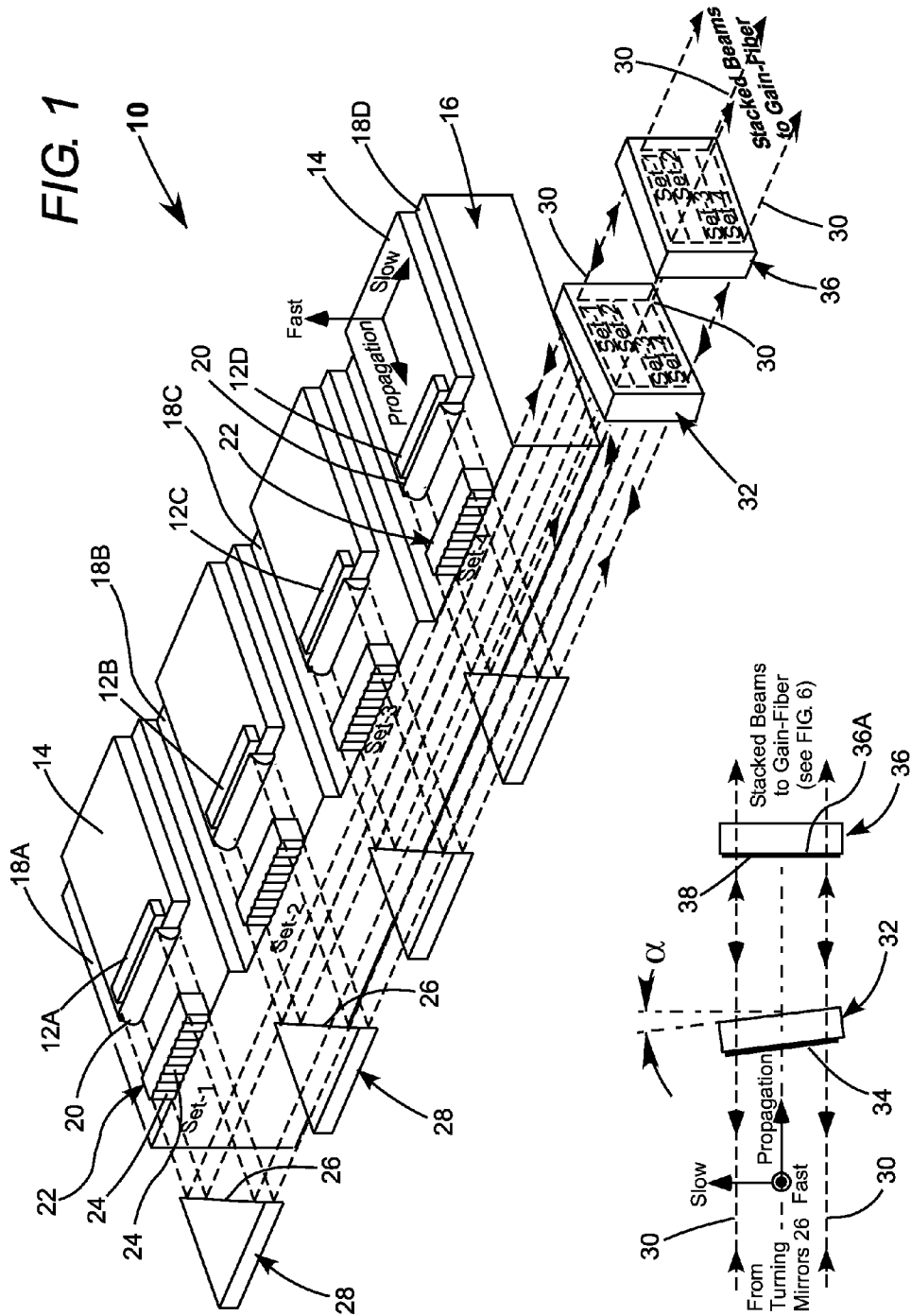
FIG. 1 schematically illustrates a pump-radiation generator in accordance with the present invention, including a plurality of diode-laser bars with output beams thereof collimated in the fast-axis and the slow-axis and stacked in the fast-axis to form an output of the generator, the wavelength of the diode-laser bars being locked by a single feedback mirror in combination with a band-pass filter tilt tunable for selecting the locking wavelength.
FIG. 1A schematically illustrates detail of the feedback mirror and band-pass filter in the pump-radiation generator of FIG. 1.

Referring now to the drawings, wherein like components are designated by like reference numerals, FIG. 1 schematically illustrates one example 10 of a pump radiation generator (light-engine) in accordance with the present invention for optically pumping a fiber laser in accordance with the present invention. Generator 10 includes four diode-laser bars 12A, 12B, 12C, and 12D. The diode-laser bars are individually mounted on separate sub-mounts 14. The sub-mounts in turn are mounted on surfaces 18A, 18B, 18C, and 18D which are arranged as steps on a common base 16.

Each diode-laser bar is characterized by a slow-axis in the length direction of a bar and a fast-axis in the height direction of the diode-laser bar, i.e., perpendicular to the slow-axis. Light from the diode-laser bars propagates around a propagation axis perpendicular to the fast-axis and the slow-axis. As is known in the art, a diode-laser bar includes a plurality of individual emitters aligned in the slow-axis. The individual emitters have an emitting aperture with a width between about 20 μm and 150 μm and a height of about 1.0 μm. The emitter width is in the slow-axis and the emitter height is in the fast-axis.

Associated with each of the diode-laser bars is a fast-axis collimating lens 20 which collimates the radiation beam from each emitter in the fast-axis. The fast-axis collimated beams are then individually collimated in the slow-axis by cylindrical lenses 24 in an array 22 thereof. It is assumed here for convenience of illustration that there are ten (10) emitters in each diode-laser bar requiring that there are ten lenses 24 in each array 22 thereof. The scale of the drawing does not permit depicting the individual emitters, but the emitter arrangements of a diode-laser bar are well known to those familiar with the art to which the present invention pertains.

The fast-axis and slow-axis collimated beams from diode-laser bars 12A, 12B, 12C, and 12D are designated set-1, set-2, set-3, and set-4 respectively. Each set of collimated beams is turned by a corresponding one of four turning-mirrors, here, coated on a face of one of four thin prisms 28. The turning mirrors are aligned, and the step heights of surfaces 18A, 18B, 18C, and 18D are selected such that the sets of collimated beams are caused to propagate parallel to the propagation axis (which is also turned by the mirrors) with the sets stacked one above the other, about contiguous, in the fast-axis. The rectangular stack of beam-sets is designated in FIG. 1 as bounded by rays 30.

Continuing with reference to FIG. 1 and with reference in addition to FIG. 1A, beams in the stack of beam sets are transmitted through an interference band-pass filter 34 coated on one surface of a substrate 32. The opposite surface is preferably anti-reflection coated. The transmitted stack of beam sets is then incident on a feedback mirror 38 which is partially reflective at the lasing wavelength. Here the mirror is depicted as a coating 38 on a surface 36A of a substrate 36. The opposite surface of substrate 36 is antireflection coated at the lasing wavelength. The band-pass filter and the feedback mirror provide for locking the lasing wavelength at a desired center wavelength. The band-pass filter preferably has a FWHM bandwidth of between about 0.1% and about 0.4% of the lasing wavelength.

The feedback mirror preferably has a reflectivity at the lasing wavelength of between about 5% and 10% percent. In the case of a reflectivity of about 5% the mirror surface can be left uncoated. For less than 5% reflection, a reflection-reducing coating can serve as the mirror coating. The reflecting surface 36A must be polished to a high surface quality. The wave-front specification of the surface is preferably less than one-tenth of a wavelength (the lasing wavelength) RMS, and more preferably less than one-twentieth of a wavelength RMS, over the full aperture of the stacked beam-sets.

This high surface-quality permits the feedback mirror to be aligned normal to the propagation axis such that all beams in the stack of beam-sets are directed back to the particular emitter from whence they came. Band-pass filter 34 must be aligned at non-normal incidence to the propagation-axis because some of what might be less than 100% transmission in the filter pass-band could be reflection. In FIG. 1A the incidence angle is indicated by angle α. Were the filter at normal incidence to the propagation axis, this reflection could compete with the feedback mechanism of the feedback mirror and interfere with the wavelength locking. The incidence angle is preferably between about five degrees (5°) and ten degrees (10°). The incidence angle can be made variable within this range which will provide some measure of tuning within the gain-bandwidth of the diode-laser emitters.

As is known in the art, feeding back a narrow wavelength band of light to the diode laser functions to lock the output of the diode laser at that wavelength.

It should be noted here while generator 10 is described as incorporating 4 diode-laser bars, this number should not be considered limiting. Additional diode-laser bars can be added on steps of a separate stepped base (with different step-heights) facing that base depicted in FIG. 1 This could allow a total of up to eight bars in the same propagation axis distance as the four depicted.

Figure 2:
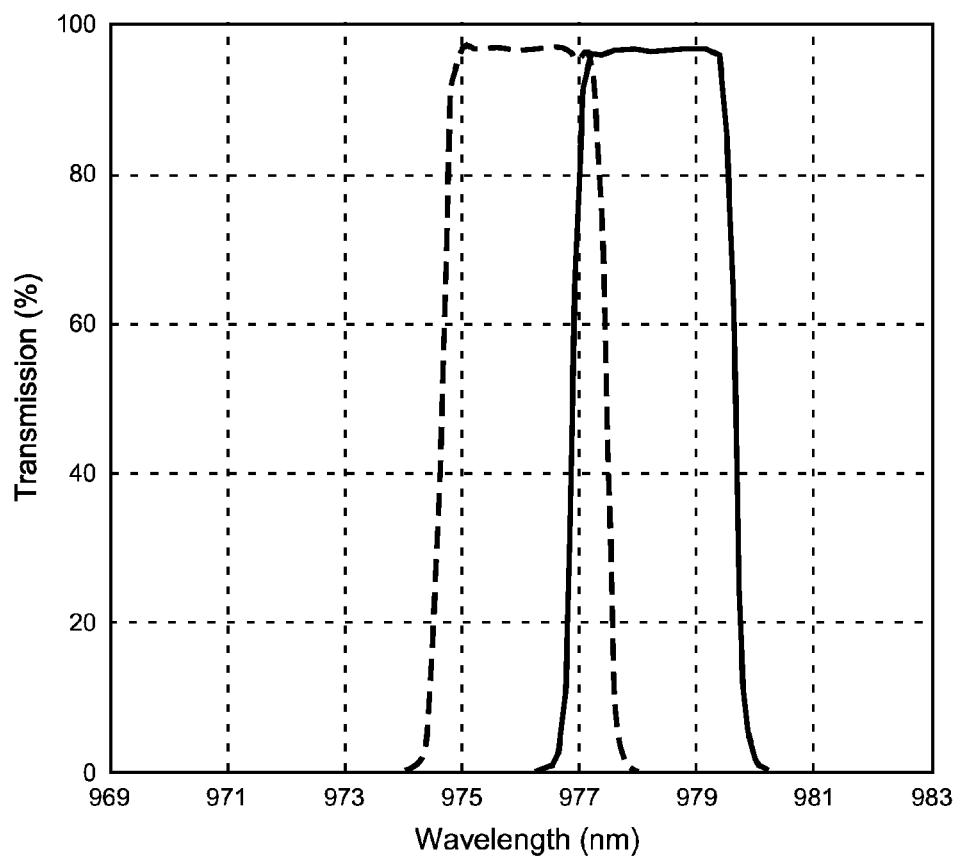
FIG. 2 is a graph schematically illustrating measured transmission as a function of wavelength of a band-pass filter used in an example of the pump-radiation generator of FIG. 1.

FIG. 2 is a graph schematically illustrating measured transmission as a function of wavelength at two different angles of a band-pass filter having bandwidth of about 0.3% of nominal center wavelength. The solid curve is measured at 14°-incidence while the dashed curve is measured at 16°-incidence. This filter was used in an experimental example of generator 10 discussed hereinbelow which included five diode-laser bars.

Figure 3:
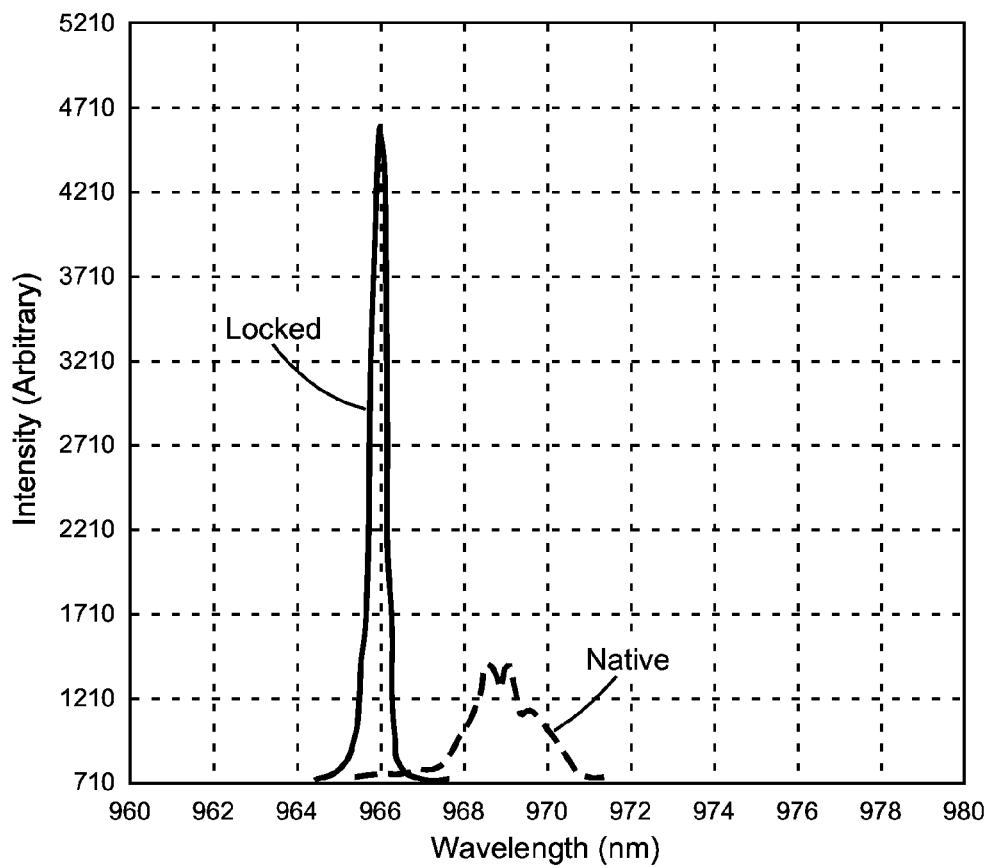
FIG. 3 is a graph schematically illustrating measure output intensity as a function of wavelength for the generator example of FIG. 2 with and without the locking arrangement of feedback mirror and band-pass filter.

FIG. 3 is a graph schematically illustrating the measured, locked output-spectrum (solid curve) of an example of a generator similar to the generator of FIG. 1 but including five diode-lasers bars with three diode-laser bars on a first stepped base and two diode-laser bars on a second stepped base facing the first stepped base. The spectrum of the generator without the locking arrangement of feedback mirror and band-pass filter (native spectrum) is indicated by a dashed curve. The filter of FIG. 2 was used in the locking arrangement. The reflectivity of the feedback mirror is about 15%. Here, the generator was operated in a quasi CW (QCW or high repetition rate pulsed) mode. The incidence angle on the band-pass filter was six degrees (6°).

Figure 4:
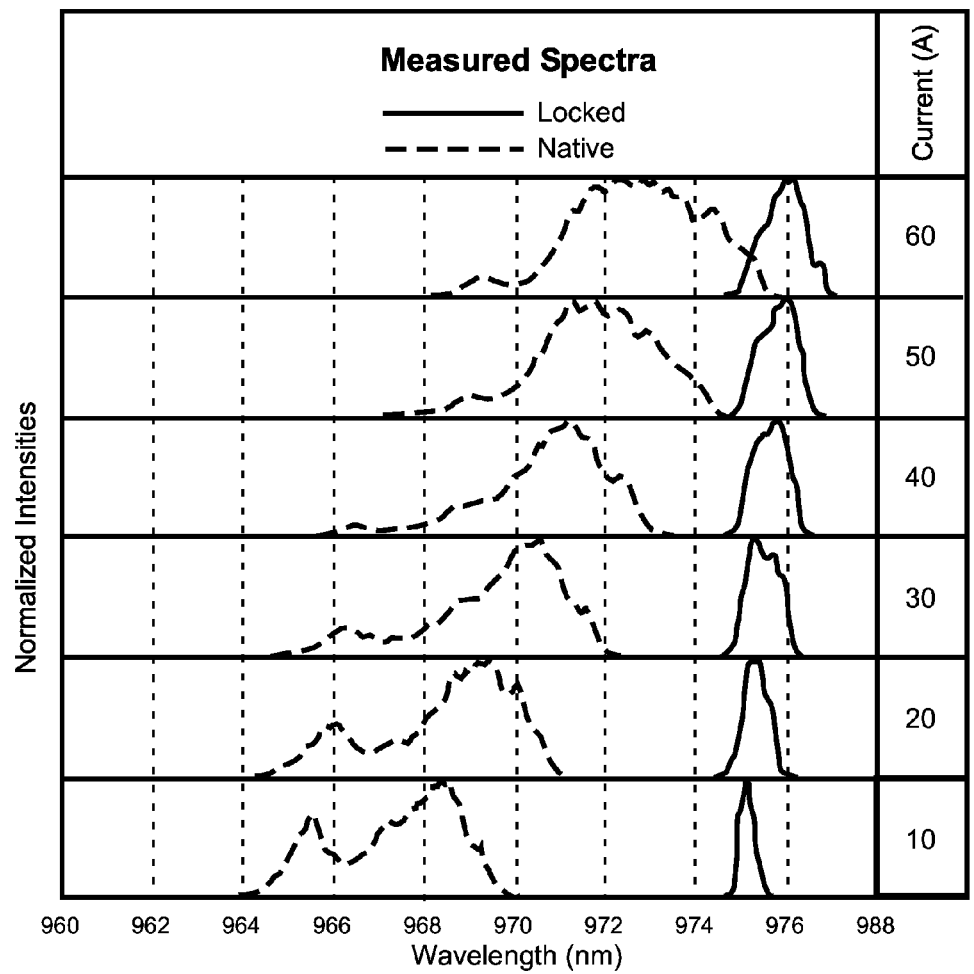
FIG. 4 is a series of graphs schematically illustrating normalized, measured output intensity as a function of wavelength for the generator example of FIG. 2, for various diode-laser bar currents, with and without the locking arrangement of feedback mirror and band-pass filter.

FIG. 4 is a series of graphs schematically illustrating normalized locked and native spectrums (solid and dashed curves respectively) for the generator example of FIG. 3 as a function of the current through each of the five diode-laser bars. The angle of incidence of the band-pass filter was fixed at sixteen degrees (16°). It can be seen that over the range of diode-laser bar currents from 10 A to 60 A the native spectrum shifts to longer wavelengths by about 5 nm while the locked spectrum shifts to longer wavelengths by only about 1 nm. In this experiment the apparatus was operated in a CW mode.

Figure 5:
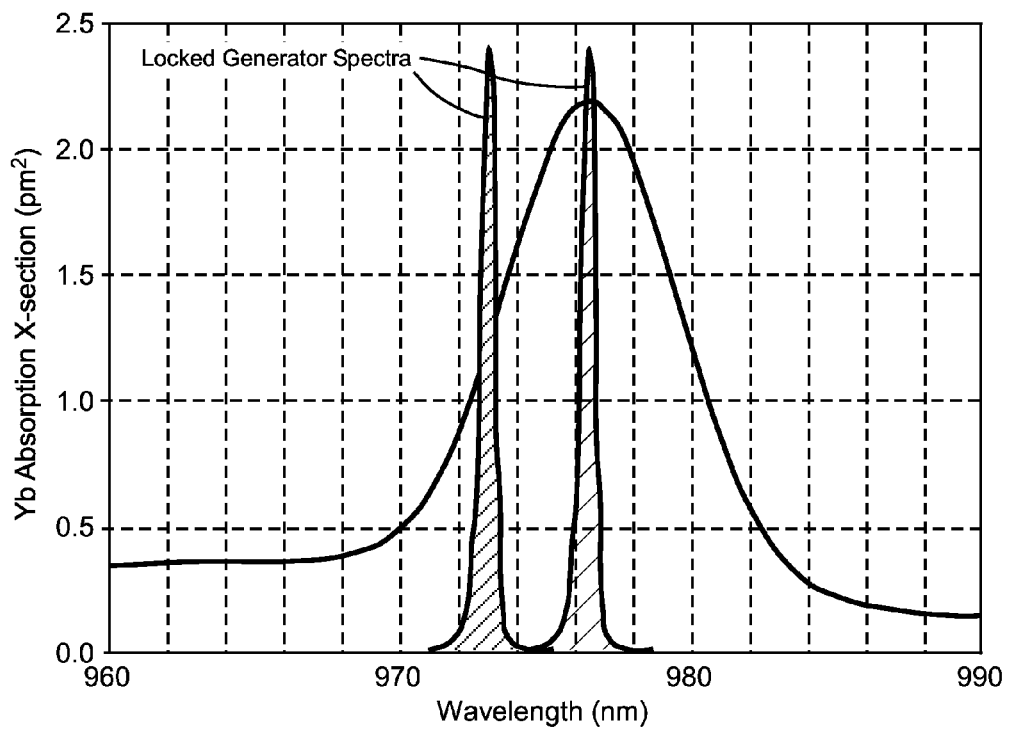
FIG. 5 is a graph schematically illustrating absorption cross-section as a function of wavelength for Yb-doped fiber, with exemplary locked-wavelength spectra of FIG. 3 superposed for comparison.

FIG. 5 is a graph schematically illustrating the absorption cross-section as a function of wavelength for an ytterbium-doped (Yb-doped) gain-fiber. Also depicted are schematic representations of wavelength-locked output spectra. Each spectrum is similar to the locked spectrum of FIG. 2. One spectrum is aligned with the absorption peak, the other aligned at a value of about 50% of peak. Tuning from one value to another by providing a tilt tuning of the band-pass filter in the inventive wavelength-locking arrangement is of significant advantage in optimizing the performance of a fiber laser. An ability to vary the bandwidth and even the band-pass shape provides a further advantage and an arrangement for effecting such bandwidth-tuning is discussed further hereinbelow.

Figure 6:
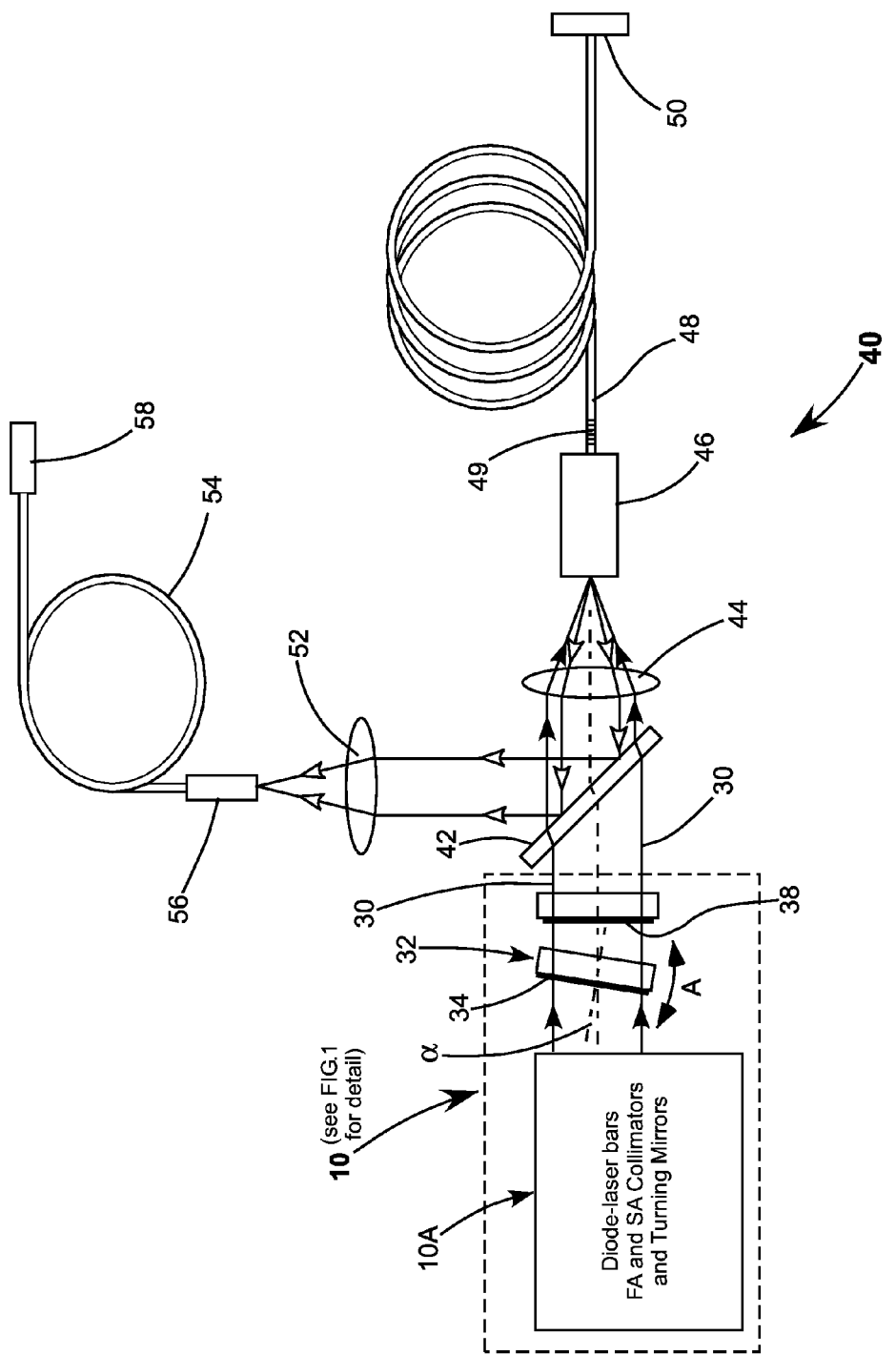
FIG. 6 schematically illustrates a preferred embodiment of a fiber-laser in accordance with the present invention optically pumped by the pump-radiation generator of FIG. 1.

FIG. 6 schematically illustrates a preferred embodiment 40 of a CW fiber-laser in accordance with the present invention. Laser 10 is optically pumped by the inventive wavelength-locked generator 10 of FIG. 1. For convenience of illustration the diode-laser bars, fast-axis and slow-axis collimators, and turning-mirrors are depicted as collected into a unit 10A. The wavelength locking arrangement of band-pass filter 34 (on substrate 32) and mirror 36 are individually depicted. In this arrangement the incidence angle of radiation on the band-pass filter is variable, as indicated by double arrowheads A, to provide tuning of the wavelength-locked output.

The output stacked beam-sets form generator 10 are transmitted through a dichroic mirror 42 and focused by a lens 44, via a pump-radiation coupler 46, into a gain-fiber 48. A laser-resonator is formed in the gain-fiber between a partially reflecting and partially transmitting fiber Bragg grating (FBG) 49 and a dielectric mirror 50. Laser-radiation generated by the optical pumping exits the resonator (gain-fiber) at the pump-radiation input end. The laser-radiation is designated by open arrowheads. Pump-radiation is designated by solid arrow heads. Details of a coupler suitable for coupler 46 are described in U.S. patent application Ser. No. 13/074,593, filed Mar. 29, 2011, assigned to the assignee of the present invention, the complete disclosure of which is hereby incorporated by reference.

The laser radiation is reflected by dichroic mirror 42 (transmissive for pump radiation and reflective for laser radiation) to a lens 52, which focuses the laser radiation, into a transport fiber 54. The transport fiber is equipped with input and output ferrules 56 and 58, respectively, and serves to transport the laser-radiation to a point of use.

FIG. 7 and FIG. 7A schematically illustrates one preferred embodiment 60 of a fiber-amplifier in accordance with the present invention. Amplifier 60 is similar to laser 10 of FIG. 6 with an exception that gain-fiber 48 is now used in single pass providing a final power amplification stage for pulses from a seed-pulse generating laser (seed-laser) amplified by one or more pre-amplifiers. Pump-radiation generator 11 replaces generator 10 of the laser of FIG. 6. Generator 11 differs from generator 10 inasmuch as an additional interference filter 35 is added to the inventive wavelength-locking arrangement. Filter 35 is also tilt tunable as indicated by double arrowheads B.

Referring in particular to FIG. 7A, filters 34 and 35 are selected such that respective transmission bands 34' (dashed curve) and 35' (fine solid curve) thereof are wider than the desired locking band-width. The pass-bands overlap in wavelength space to provide a net pass-band 37 (bold solid curve) narrower than the pass-band of either filter 34 or 35. Varying the tilt angle of the filters as indicated by arrowheads A and B in FIG. 7, shifts the center-wavelengths of the pass-bands as indicated, respectively, by arrowheads A' and B' in FIG. 7A.

Moving the pass-bands toward or away from each other, respectively broadens or narrows net pass-band 37. Moving both pass-bands in the same direction by the same amount moves whatever pass-band is current to longer or shorter wavelengths. Moving both pass-bands in the same direction, but by different amounts moves net pass-band 37 to longer or shorter wavelengths, while increasing or decreasing the bandwidth of the net pass-band. By providing different slopes to the band-pass filters (at the design and manufacture stage) a skewed net pass-band can be obtained. In FIG. 7A, for example, the net pass-band is skewed with the short-wavelength band-edge having a shallower slope than the long wavelength band-edge. If only relatively shallow slopes are required edge-filters (one long-wavelength-pass and one short-wavelength-pass can be substituted. The two-filter, wave-length locking arrangement in the fiber amplifier of FIG. 7, can, of course, be used in the fiber laser of FIG. 6.

FIG. 8 schematically illustrates another preferred embodiment of a fiber-amplifier 70 in accordance with the present invention. This embodiment is similar to apparatus 60 of FIG. 7 with an exception that pump-radiation generator 13 replaces generator 11 of the amplifier of FIG. 7. Generator 13 differs from generator 11 inasmuch as serial band-pass filter elements 34 and 36 of generator 11 are replaced by a band-pass filter 72 formed by two band-pass filter elements 74 and 76 used in a reflective mode. Transmission of stacked beam-sets 30 through band-pass filter 72 is achieved by successive reflections from elements 74 and 76. The corresponding reflection spectra 74' and 76' are depicted in FIG. 8A. The spectra are overlapped in wavelength space to provide a net equivalent transmission spectrum 77 for band-pass filter 72. Edge filter elements, similarly arranged, can be substituted for the bandpass filter elements.

An advantage of this band-pass filter arrangement is that the reflectivity of the filter elements can be sufficiently greater than 99%, that the net loss on the two reflections can be less than 1%. In the transmission band-pass filter arrangement of FIG. 7, transmission loss can be as high as about 5% in practice. A disadvantage of the arrangement of FIG. 8 is that tunability of band-pass filter 72 is limited by alignment requirements for the elements. Further the reflective surfaces of the elements will need to be of an optical quality comparable with that of feedback-mirror 36.

In summary embodiments of a fiber-laser and a fiber-amplifier in accordance with the present invention include a pump-radiation generator in which stacked pump radiation beams from a plurality of diode-laser bars are wavelength locked by an arrangement of a feedback mirror in combination with one or two interference filters providing a narrow net bandwidth narrower than the gain-bandwidth of the diode-laser bars. The net band-width can be tuned in center wavelength or in center wavelength and bandwidth which provides a means of optimizing a pump-radiation spectrum for a particular fiber-material or fiber length. The invention is not limited, however, to the particular embodiments described and depicted herein. Rather, the invention is limited only by the claims appended hereto.

What is claimed is:

1. Fiber laser apparatus comprising:
   a gain-fiber;
   a band-pass filter including at least one filter element;
   a partially reflective and partially transmissive feedback mirror;
   a focusing lens;
   a plurality of diode-laser bars each thereof including a plurality of diode-laser emitters each emitter for emitting a beam of radiation having a lasing wavelength, the diode-laser bars and emitters therein characterized as having a slow-axis in the length of the diode-laser bars, a fast-axis in the height direction of the diode-laser bars and a propagation axis perpendicular to the fast-axis and the slow-axis;
   each diode-laser bar having a first collimating lens associated therewith for collimating the beams of radiation from the emitters in the fast-axis, and plurality of second collimating lenses associated therewith for collimating the fast-axis collimated beams in the slow-axis thereby producing a set of fast- and slow-axis collimated beams propagating from each of the diode-laser bars;
   wherein the fast- and slow-axis collimated beam-sets are transmitted through the band-pass filter in a forward direction on beam-paths parallel to each other in the fast-axis to the feedback mirror, the feedback mirror being arranged to reflect a first portion of the radiation in each of the beams-sets back through the band-pass filter in a reverse direction along the beam paths to the diode-laser bars from which the beam-sets were emitted for locking the lasing wavelength at a value determined by the band-pass filter; and
   wherein a second portion of the radiation in the beam-sets is transmitted through the feedback mirror to the focusing lens, and focused by the focusing lens into one end of the gain-fiber for optically pumping the gain-fiber.

2. The apparatus of claim 1 wherein band-pass filter includes only one filter element arranged at a non-normal angle of incidence to the beam paths.

3. The apparatus of claim 2, wherein the angle of incidence of the filter element is between about 5 and 20 degrees.

4. The apparatus of claim 2, wherein the angle of incidence of the filter element is variable for varying the lasing wavelength of the diode-laser bars.

5. The apparatus of claim 1, wherein the band-pass filter includes two filter elements, each thereof arranged at a non-normal angle of incidence to the beam paths.

6. The apparatus of claim 5, wherein the angle of incidence each of the filter elements is variable for varying the lasing wavelength of the diode-laser bars.

7. The apparatus of claim 5, wherein the filter elements are reflective elements, and wherein the fast- and slow-axis collimated beam-sets are transmitted through the band-pass filter by reflection from each of the filter elements.

8. The apparatus of claim 1, wherein the feedback-mirror has a reflectivity between about 5% and 10% at the lasing wavelength.

9. The apparatus of claim 1, wherein the gain-fiber has a laser-resonator formed therein.

10. The apparatus of claim 1 wherein the gain-fiber is fiber-amplifier stage of the apparatus.

11. Fiber laser apparatus comprising:
    a gain-fiber;
    a band-pass filter;
    a partially reflective and partially transmissive feedback mirror;
    a focusing lens;
    a plurality of diode-laser bars each thereof including a plurality of diode-laser emitters each emitter for emitting a beam of radiation having a lasing wavelength, the diode-laser bars and emitters therein characterized as having a slow-axis in the length of the diode-laser bars, a fast-axis in the height direction of the diode-laser bars and a propagation axis perpendicular to the fast-axis and the slow-axis;
    each diode-laser bar having a first collimating lens associated therewith for collimating the beams of radiation from the emitters in the fast-axis, and plurality of second collimating lenses associated therewith for collimating the fast-axis collimated beams in the slow-axis thereby producing a set of fast- and slow-axis collimated beams propagating from each of the diode-laser bars;
    wherein the fast- and slow-axis collimated beam-sets are transmitted through the band-pass filter in a forward direction on beam-paths parallel to each other in the fast-axis to the feedback mirror, the feedback mirror being arranged to reflect a first portion of the radiation in each of the beams-sets back through the band-pass filter in a reverse direction along the beam paths to the diode-laser bars from which the beam-sets were emitted for locking the lasing wavelength at a value determined by the band-pass filter;
    wherein the band-pass filter is at a non-normal incidence angle to the beam paths, the incidence angle being selectively variable for selectively varying the locked lasing wavelength; and
    wherein a second portion of the radiation in the beam-sets is transmitted through the feedback mirror to the focusing lens, and focused by the focusing lens into one end of the gain-fiber for optically pumping the gain-fiber.

12. The apparatus of claim 11, wherein the angle of incidence of the filter element is between about 5 and 20 degrees.

* * * * *